(12) United States Patent
Thompson et al.

(10) Patent No.: US 9,721,787 B2
(45) Date of Patent: Aug. 1, 2017

(54) FILM DEPOSITION USING TANTALUM PRECURSORS

(71) Applicant: Applied Materials, Inc., Santa Clara, CA (US)

(72) Inventors: David Thompson, San Jose, CA (US); Jeffrey W. Anthis, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 601 days.

(21) Appl. No.: 13/713,578

(22) Filed: Dec. 13, 2012

(65) Prior Publication Data

US 2013/0157475 A1 Jun. 20, 2013

Related U.S. Application Data

(60) Provisional application No. 61/576,677, filed on Dec. 16, 2011, provisional application No. 61/609,535, filed on Mar. 12, 2012.

(51) Int. Cl.
*H01L 21/02* (2006.01)
*C23C 16/455* (2006.01)
*C23C 16/507* (2006.01)
*C23C 16/511* (2006.01)
*H01L 21/3205* (2006.01)

(52) U.S. Cl.
CPC .. *H01L 21/02271* (2013.01); *C23C 16/45531* (2013.01); *C23C 16/45536* (2013.01); *C23C 16/45553* (2013.01); *C23C 16/507* (2013.01); *C23C 16/511* (2013.01); *H01L 21/32051* (2013.01)

(58) Field of Classification Search
None
See application file for complete search history.

(56) References Cited

U.S. PATENT DOCUMENTS

| 6,552,209 | B1* | 4/2003 | Lei et al. ......................... 556/42 |
| 2004/0208994 | A1 | 10/2004 | Harkonen et al. |
| 2008/0268642 | A1 | 10/2008 | Yanagita et al. |
| 2008/0286983 | A1 | 11/2008 | Dussarrat |
| 2009/0315093 | A1* | 12/2009 | Li et al. ........................ 257/314 |
| 2011/0017997 | A1* | 1/2011 | Kamath et al. .................. 257/66 |
| 2011/0071316 | A1* | 3/2011 | Millward et al. ............. 564/278 |
| 2011/0263115 | A1 | 10/2011 | Ganguli et al. |

FOREIGN PATENT DOCUMENTS

| EP | 1205574 | 5/2002 |
| JP | 2000103796 A | 4/2000 |
| KR | 2002/0037293 | 5/2002 |
| KR | 2010/0134676 | 12/2010 |
| TW | 201000667 A1 | 1/2010 |
| TW | 2011117360 A | 5/2011 |

OTHER PUBLICATIONS

Jayaratne et al., "Imido Complexes Derived from the Reactions of Niobium and Tantalum pentachlorides with Primary Amines: Relevance to the Chemical Vapor Deposition of Metal Nitride Films," Inorg. Chem., 1996, 35, 4910-4920.*
Chizhikova et al., "Study of the Thermal Decomposition of Niobium and tantalum Chloride—Organic Complexes," Izvestiya Akademi Nauk SSSR, Metally (1980), (5), 64-71 (English Abstract).*
"International Search Report and Written Opinion of PCT/US2012/069634", mailed on Apr. 10, 2013 , 12 pgs.
PCT International Preliminary Report on Patentability in PCT/US2012/069634, mailed Jun. 26, 2014, 8 pages.

* cited by examiner

*Primary Examiner* — Asok K Sarkar
(74) *Attorney, Agent, or Firm* — Servilla Whitney LLC

(57) ABSTRACT

Provided are methods of depositing tantalum-containing films via atomic layer deposition and/or chemical vapor deposition. The method comprises exposing a substrate surface to flows of a first precursor comprising $TaCl_xR_{5-x}$, $TaBr_xR_{5-x}$ or $TaI_xR_{5-x}$, wherein R is a non-halide ligand, and a second precursor comprising an aluminum-containing compound, wherein x has a value in the range of 1 to 4. The R group may be C1-C5 alkyl, and specifically methyl. The resulting films comprise tantalum, aluminum and/or carbon. Certain other methods relate to reacting $Ta_2Cl_{10}$ with a coordinating ligand to provide $TaCl_5$ coordinated to the ligand. A substrate surface may be exposed to flows of a first precursor and second precursor, the first precursor comprising the $TaCl_5$ coordinated to a ligand, the second precursor comprising an aluminum-containing compound.

15 Claims, No Drawings

FILM DEPOSITION USING TANTALUM PRECURSORS

CROSS-REFERENCE TO RELATED APPLICATIONS

This application claims priority to U.S. Provisional Application Nos. 61/576,677, filed Dec. 16, 2011 and 61/609,535, filed Mar. 12, 2012.

TECHNICAL FIELD

Embodiments of the present invention generally relate to film deposition, and specifically to the deposition of films using a tantalum precursor.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires high level control of thin film deposition to produce conformal coatings on high aspect structures.

As well known in the art, a silicon oxide film has been mainly used as a material of a gate insulating film in MOSFETs, and a polysilicon film has been used as a material of the gate. However, as the integration level of the semiconductor devices becomes higher, it is required that the line width of the gate and the thickness of the gate insulating film be reduced. In the case where a silicon oxide film is used as the material of the gate insulating film, if the thickness of the gate insulating film is too thin, the insulating characteristic is not stable since the leakage current due to a direct tunneling through the gate insulating film becomes greater. Recently there has been an effort to use a high dielectric constant material, having a relatively higher dielectric constant than a silicon oxide film, as the material of the gate insulating film. Also, in order to minimize the polysilicon gate depletion effect, there has been an effort to use a metal gate instead of the polysilicon gate.

As such, there is a need for improved methods of depositing suitable N-metals for such applications. Chemical and physical vapor depositions have been methods well-known to deposit such films. Another method for deposition of thin films is atomic layer deposition (ALD). Most ALD processes are based on binary reaction sequences, where each of the two surface reactions occurs sequentially. Because the surface reactions are sequential, the two gas phase reactants are not in contact, and possible gas phase reactions that may form and deposit particles are limited. While ALD tends to result in more conformal films than traditional chemical vapor deposition (CVD), prior art processes for ALD have been most effective for deposition of metal oxide and metal nitride films.

Tantalum, $Ta_xC_y$, and $Ta_xAl_yC_z$ films show much potential as n-metals. Thus, there is a need for a method that can deliver Ta precursors to deposition reactors and enable the deposition of specific desirable film compositions comprising Ta.

SUMMARY

Provided herein are methods of depositing tantalum-containing films. A first aspect of the invention relates to a method of depositing a film, the method comprising exposing a substrate surface to flows of a first precursor comprising $TaCl_xR_{5-x}$, $TaBr_xR_{5-x}$, or $TaI_xR_{5-x}$, wherein R is a non-halide ligand, and a second precursor comprising an aluminum-containing compound, wherein x has a value in the range of 1 to 4. In one or more embodiments, the first precursor comprises $TaCl_xR_{5-x}$. In one or more embodiments, R is C1-C5 alkyl. In further embodiments, R comprises a methyl group. In specific embodiments, the first precursor is selected from $TaCl_2R_3$ or $TaCl_3R_2$, wherein R is a non-halide ligand. In further embodiments, R is a methyl group.

The precursors can be varied. Thus in one or more embodiments, the aluminum-containing compound comprises an aluminum hydrocarbon. In further embodiments, the aluminum hydrocarbon comprises one or more of trimethyl aluminum, triethyl aluminum or dimethyl aluminum hydride. In other embodiments, the aluminum-containing compound comprises an alane-amine complex. In further embodiments, the alane-amine complex comprises dimethylethylamine alane, triethylamine alane, trimethylamine alane or methylpyrrolidine alane.

The way that the substrate surface is exposed to the precursors can also be varied. Accordingly, in some embodiments of this aspect, the substrate surface is exposed to alternating flows of the first and precursor sequentially or substantially sequentially. In alternative embodiments, the substrate surface is exposed to the first and precursor concurrently or substantially concurrently.

A second aspect of the invention relates to a method of depositing a film, the method comprising exposing a substrate surface to flows of a first precursor selected from the group $TaCl_2(R)_3$ and $TaCl_3(R)_2$, wherein R comprises C1-C5 alkyl, and a second precursor comprising an aluminum-containing compound. In one or more embodiments, R comprises a methyl group.

As with before, the precursors can be varied. In one or more other embodiments, the aluminum-containing compound comprises an aluminum hydrocarbon. In further embodiments, the aluminum hydrocarbon comprises one or more of trimethyl aluminum, triethyl aluminum or dimethyl aluminum hydride. In yet further embodiments, the aluminum-containing compound comprises an alane-amine complex. Non-limiting examples of such alane-amine complexes include dimethylethylamine alane, triethylamine alane, trimethylamine alane or methylpyrrolidine alane.

The way that the substrate surface is exposed to the precursors can also be varied. Accordingly, in some embodiments of this aspect, the substrate surface is exposed to alternating flows of the first and precursor sequentially or substantially sequentially. In alternative embodiments, the substrate surface is exposed to the first and precursor concurrently or substantially concurrently.

A third aspect of the invention relates to another method of depositing a film, the method comprising exposing a substrate surface to flows of a first precursor comprising $TaCl_2(Me)_3$ or $TaCl_3(Me)_2$, and a second precursor comprising an aluminum hydrocarbon selected from triethylaluminum, trimethylaluminum and combinations thereof.

Yet another aspect of the invention relates to a method of depositing a film. The method comprises reacting $Ta_2Cl_{10}$ with a coordinating ligand to provide $TaCl_5$ coordinated to the ligand, the ligand comprising one or more of acetonitrile or a tertiary amine; and exposing a substrate surface to flows of a first precursor and second precursor, the first precursor comprising the $TaCl_5$ coordinated to a ligand, the second precursor comprising an aluminum-containing compound. In one embodiment, the ligand comprises acetonitrile. In another embodiment, the ligand comprises an amine ligand. In a more specific variant of this embodiment, the amine ligand comprises a tertiary amine.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

In accordance with various embodiments of the invention, provided are methods related to the deposition of tantalum-containing films. These films may also comprise carbon and/or aluminum. Thus, films deposited according to one or more embodiments of the invention may be elemental Ta, TaAl, TaC or TaAlC. The films deposited in accordance with one or more embodiments of the invention are N-metals, which may be suitable as an NMOS work function metal in complementary metal oxide semiconductor (CMOS) integration.

Accordingly, provided herein are methods of depositing tantalum-containing films via atomic layer deposition and/or chemical vapor deposition. Thus, one aspect of the invention relates to a method of depositing a film, which comprises exposing a substrate surface to flows of a first precursor comprising $TaCl_xR_{5-x}$, $TaBr_xR_{5-x}$, or $TaI_xR_{5-x}$, wherein R is a non-halide ligand, and a second precursor comprising an aluminum-containing compound, wherein x has a value in the range of 1 to 4. In some embodiments, the first precursor comprises $TaCl_xR_{5-x}$. In one or more embodiments, R is a C1-C5 alkyl. In specific embodiments, R is methyl. In one or more variants, the first precursor is selected from $TaCl_2R_3$ or $TaCl_3R_2$, wherein R is a non-halide ligand. In further embodiments of these variants, R may be a methyl group. Thus, in a particular embodiment of this aspect, the method comprises exposing a substrate surface to flows of a first precursor comprising $TaCl_2(Me)_3$ or $TaCl_3(Me)_2$, and a second precursor comprising an aluminum hydrocarbon selected from triethylaluminum, trimethylaluminum and combinations thereof. In other embodiments, the first precursor is selected from $TaCl_4R_1$ or $TaCl_1R_4$, wherein R is a non-halide ligand.

The first precursor is effective as a precursor for tantalum and/or carbon. While not wishing to be bound to any particular theory, it is thought that the chloride ligands are easily reduced, leaving behind the tantalum and methyl groups. They are advantaged relative to previously used tantalum halide precursors (e.g., $TaCl_5$) in that they maintain a halide functional group for reactivity but have dramatically higher vapor pressure versus the halides. Because of the higher vapor pressure, films with higher throughput processing are obtained. Other benefits include potential for decreased Al concentration in reactions between TEA/TMA and the $TaCl_xR_{5-x}$, $TaBr_xR_{5-x}$, or $TaI_xR_{5-x}$ precursor, as the Al introduction occurs primarily from the reaction of TMA with a halide bond.

The precursors for the methods described herein can be purchased directly or synthesized by methods available to one having ordinary skill in the art. For example, in some embodiments, R is methyl, such that the precursor comprises $TaCl_2(Me)_3$ or $TaCl_3(Me)_2$. $TaCl_3(Me)_2$ can be produced according to the following chemical equation I:

$$TaCl_5 + 1.5 ZnMe_2 \rightarrow TaCl_3(Me)_2 + 1.5 ZnCl_2 \qquad (I)$$

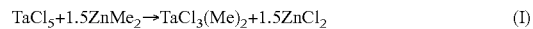

wherein $TaCl_5$ and $ZnMe_2$ are reacted in the presence of toluene. Precursors with varying values of x and alkyl groups can be produced by chemical equations analogous to equation I, by varying the alkyl groups by processes known in the art.

The second precursor is an aluminum-containing compound. In some embodiments this aspect, the second precursor comprises an aluminum hydrocarbon. Such examples include, but are not limited to trimethyl aluminum (TMA), triethylaluminum (TEA), and dimethyl aluminum hydride (DMAH).

One advantage of these processes is that the structure of the precursor is such that it prevents contamination by nitrogen. Generally, many Ta precursors are stabilized by groups containing $NR_2$ amide ligands. However, Ta is highly reducing and can sometimes react with amides to incorporate nitrogen into the ligands. This is particularly an issue where nitrogen-containing reactants are used, such as acetonitrile. However, because the $TaCl_xR_{5-x}$, $TaBr_xR_{5-x}$, or $TaI_xR_{5-x}$ precursor lacks nitrogen, there is no possibility of nitrogen incorporation into the film.

Another advantage to the $TaCl_xR_{5-x}$, $TaBr_xR_{5-x}$, or $TaI_xR_{5-x}$ precursor, wherein R is C1-C5 alkyl, is that they already and inherently contain a carbon source in the alkyl group. As such, there is no need for the second precursor to contain carbon and still achieve films comprising tantalum, aluminum and carbon. Such second precursors include, but are not limited to, alane-amine complexes. These alane-amine complexes comprise alane (also known as aluminum hydride or $AlH_3$) coordinated to amines. Alane is an unstable compound, but can be stabilized by coordination to an amine. Such precursors may be represented by the formula $AlH_3$—$NR_3$. These precursors may be synthesized according to the following equation II:

$$LiAlH_4 + NR_3 \text{—} HCl \rightarrow AlH_3 \text{—} NR_3 + H_2 + LiCl \qquad (II)$$

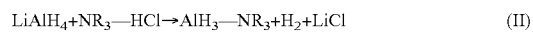

Examples of such amines include, but are not limited to, dimethylethylamine (DMA), triethylamine (TEA), trimethylamine (TMA) and N-methylpyrrolidine. The corresponding alane precursors would therefore be dimethylethylamine-alane (DMEAA), triethylamine alane (TEAA), trimethylamine alane (TMAA) and N-methylpyrrolidine alane (NPA). Thus, in a specific embodiment, the alane coordinated to an amine comprises dimethylethylamine alane, triethylamine alane, trimethylamine alane or N-methylpyrrolidine alane.

The flows of the precursors can vary in timing. In one variant of this aspect, the substrate surface may be sequentially or substantially sequentially exposed to the first and second precursor. In another variant, the exposures may be concurrently or substantially concurrently. As used herein, "substantially concurrently" means that the exposures or flows occur at the same time, or that there is some overlap in time.

Another aspect of the invention relates to using $TaCl_5$ coordinated to a ligand as a tantalum precursor. In the solid state, $TaCl_5$ exists as the dimer $Ta_2Cl_{10}$. Thus, one feature of this aspect involves increasing the reactivity of $Ta_2Cl_{10}$ by reacting it with a coordinating ligand to break the dimer and form $TaCl_5$-L, where L is the coordinated ligand. The ligand can be reacted with the $Ta_2Cl_{10}$ dimer according to the following equation (III):

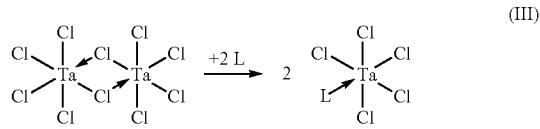

(III)

The resulting precursor has a higher vapor pressure, and can be delivered to a chamber for the deposition of tantalum-containing films. Two examples of suitable ligands include pyridine to form $(C_5H_5N)$—$TaCl_5$ and tertiary amines to form $R_3N$—$TaCl_5$. In some embodiments, acetonitrile may be used as the ligand.

Accordingly, this aspect of the invention relates to a method of depositing a film, which comprises reacting $Ta_2Cl_{10}$ with a coordinating ligand to provide $TaCl_5$ coordinated to the ligand, the ligand comprising one or more of acetonitrile or a tertiary amine; and exposing a substrate surface to flows of a first precursor and second precursor, the first precursor comprising the $TaCl_5$ coordinated to a ligand, the second precursor comprising an aluminum-containing compound.

In a more specific embodiment of this aspect, the method comprises exposing a substrate surface to flows of a first precursor comprising $TaCl_5$ coordinated to a ligand, and a second precursor comprising an aluminum-containing compound.

The ligand used in this aspect coordinates to the tantalum in $TaCl_5$ through a nitrogen atom. Accordingly, in one embodiment, the ligand comprises acetonitrile. In another embodiment, the ligand comprises an amine ligand. In a more specific embodiment, the amine ligand is a tertiary amine. Specific examples of suitable tertiary amines include, but are not limited to, $EtMe_2N$, $Et_3N$, $Me_3N$.

As with before, the aluminum-containing compound may comprise a hydrocarbon. In specific embodiments, the aluminum hydrocarbon comprise one or more of trimethyl aluminum, triethyl aluminum or dimethyl aluminum hydride. One or more of these aluminum hydrocarbons allow for the deposition of films comprises tantalum, aluminum and carbon.

The amount of aluminum content in a deposited film can also be controlled by how much amine ligand is used. In one embodiment, an excess of amine ligand is utilized. An excess of amine refers to more than one molar equivalent of amine to alane. In certain embodiments, the amine may be used as a carrier gas, which would correspond to a ratio of greater than 99:1. The use of excess amine to carry the alane can be used as a method of decreasing the aluminum concentration in the film.

In one or more embodiments, films are deposited using a chemical vapor deposition process. In such a process, the substrate may be exposed to both precursors simultaneously, or substantially simultaneously.

In another embodiment, films are deposited using an atomic layer deposition (ALD) process. Therefore, in one embodiment, contacting the substrate surface with first and second precursors occurs sequentially or substantially sequentially. In a more specific embodiment, the method comprises metal halide exposure, followed by purge, followed by exposure to an aluminum-containing compound, followed by another purge. In exemplary embodiment of an ALD process, a first chemical precursor ("A") is pulsed or flowed, for example, $TaCl_5$ coordinated to a ligand or $TaCl_2(Me)_3$, to the substrate surface in a first half reaction. Excess reactants and the reaction by-products are removed, typically by an evacuation-pump down and/or by a flowing inert purge gas. Then a co-reactant or precursor "B", an aluminum-containing compound, is delivered to the surface, wherein the previously reacted terminating substituents or ligands of the first half reaction are reacted with new ligands from the "B" co-reactant, creating an exchange by-product. A second purge period is typically utilized to remove unused reactants and the reaction by-products. The "A" precursor, "B" co-reactants or precursors, and purge gases can then again be flowed. The alternating exposure of the surface to reactants "A" and "B" is continued until the desired thickness film is reached, which for most anticipated applications would be approximately in the range of 5 nm to 40 nm, and more specifically in the range of 10 and 30 nm (100 Angstroms to 300 Angstroms). It will be understood that the "A", "B", and purge gases can flow simultaneously, and the substrate and/or gas flow nozzle can oscillate such that the substrate is sequentially exposed to the A, purge, and B gases as desired.

The precursors and/or reactants may be in a state of gas or vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

Thus, in one or more embodiments, alternating pulses or flows of "A" precursor and "B" co-reactant can be used to deposit a film, for example, in a pulsed delivery of multiple cycles of pulsed precursors and co-reactants, for example, A pulse, B co-reactant pulse, A precursor pulse, B co-reactant pulse, A precursor pulse, B co-reactant pulse, A precursor pulse, B co-reactant pulse. As noted above, instead of pulsing the reactants, the gases can flow simultaneously from a gas delivery head or nozzle and the substrate and/or gas delivery head can be moved such that the substrate is sequentially exposed to the gases.

Of course, the aforementioned ALD cycles are merely exemplary of a wide variety of ALD process cycles in which a deposited layer is formed by alternating layers of precursors and/or co-reactants.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming tantalum-containing films, a processing chamber is configured to expose the substrate to a sequence of gases and/or plasmas during the vapor deposition process. The processing chamber would include separate supplies of the A and B reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform an ALD process as described herein. The central processing unit may be one of any forms of a computer processor that can be used in an industrial setting for controlling various chambers and subprocessors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The reactants are typically in vapor or gas form. The reactants may be delivered with a carrier gas. A carrier gas, a purge gas, a deposition gas, or other process gas may contain nitrogen, hydrogen, argon, neon, helium, or combinations thereof. Plasmas may be useful for depositing, forming, annealing, treating, or other processing of photoresist materials described herein. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially or substantially sequentially pulsed to and through a showerhead. Alternatively, as described above, the gases can flow simultaneously or substantially simultaneously through gas supply nozzle or head and the substrate and/or the gas supply head can be moved so that the substrate is simultaneously or substantially simultaneously exposed to the gases.

Thus, another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of a precursor comprising a $TaCl_xR_{5-x}$, $TaBr_xR_{5-x}$, or $TaI_xR_{5-x}$ precursor, R is a non-halide ligand, and a second precursor comprising an aluminum-containing compound, wherein x has a value in the range of 1 to 4. The apparatus also includes a reactant gas inlet in fluid communication with a supply of a precursor comprising an aluminum-containing compound, as discussed above. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming photoresist materials can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780,785.

The ALD process provides that the processing chamber or the deposition chamber may be pressurized at a pressure within a range from about 0.01 Torr to about 100 Torr, for example from about 0.1 Torr to about 10 Torr, and more specifically, from about 0.5 Torr to about 5 Torr. Also, according to one or more embodiments, the chamber or the substrate may be heated such that deposition can take place at a temperature lower than about 200° C. In other embodiments, deposition may take place at temperatures lower than about 100° C., and in others, even as low as about room temperature. In one embodiment, deposition is carried out at a temperature range of about 50° C. to about 100° C.

Delivery of "A" Precursor to Substrate Surface

The substrate can be exposed to the "A" precursor gas or vapor formed by passing a carrier gas (for example, nitrogen or argon) through an ampoule of the precursor, which may be in liquid form. The ampoule may be heated. The "A" precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to the metal-containing "A" precursor gas for a time period within a range from about 0.1 seconds to about 10 seconds, for example, from about 1 second to about 5 seconds, and in a specific example, for approximately 2 seconds. The flow of the "A" precursor gas is stopped once the precursor has adsorbed onto all reactive surface moieties on the substrate surface. In some embodiments, the surface is readily saturated with the reactive precursor "A" such that additional exposure would not result in additional deposition.

First Purge

The substrate and chamber may be exposed to a purge step after stopping the flow of the "A" precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

Delivery of "B" Precursor to Substrate Surface

After the first purge, the substrate active sites can be exposed a "B" precursor gas or vapor formed by passing a carrier gas (for example, nitrogen or argon) through an ampoule the "B" co-reactant. The ampoule may be heated. The "B" reactant gas can be delivered at any suitable flow rate within a range from about 10 sccm to about 2,000 sccm, for example, from about 50 sccm to about 1,000 sccm, and in specific embodiments, at about 200 sccm. The substrate may be exposed to the "B" reactant gas for a time period within a range from about 0.1 seconds to about 8 seconds, for example, from about 1 second to about 5 seconds, and in a specific example, for about 2 seconds. The flow of the "B" reactant gas may be stopped once "B" has adsorbed onto and reacted with readily "A" precursor deposited in the preceding step.

Second Purge

The substrate and chamber may be exposed to a purge step after stopping the flow of the "B" co-reactant gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen. The "B" precursor gas may also be in the form of a plasma generated remotely from the process chamber.

In another embodiment, the films may be formed during plasma enhanced atomic layer deposition (PEALD) process that provides sequential pulses of a precursor(s) and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator.

A substrate can be any type of substrate described above. An optional process step involves preparation of a substrate by treating the substrate with a plasma or other suitable surface treatment to provide active sites on the surface of the substrate. Examples of suitable active sites include, but are not limited to O—H, N—H, or S—H terminated surfaces.

The relative amounts of tantalum, aluminum carbon, etc., can be adjusted by controlling the ratio of precursor to reactant, changing deposition temperature and by using excess $Cl_2$. The films formed in accordance with one or more embodiments of the invention have several useful applications. These include use as metal electrode films, work function films, copper diffusion barrier films and semipermeable diffusion barriers.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a film on a surface of a semiconductor wafer by atomic layer deposition, the method comprising:
    exposing the surface of the semiconductor wafer to alternating flows of a first precursor comprising $TaCl_xR_{5-x}$, $TaBr_xR_{5-x}$, or $TaI_xR_{5-x}$, wherein R is a $C_1$-$C_5$ alkyl ligand, and a second precursor comprising an aluminum-containing compound comprising an alane-amine complex sequentially, wherein x has a value in the range of 1 to 4.

2. The method of claim 1, wherein R comprises a methyl group.

3. The method of claim 1, wherein the first precursor is selected from $TaCl_2R_3$ or $TaCl_3R_2$.

4. The method of claim 1, wherein the aluminum-containing compound further comprises an aluminum hydrocarbon.

5. The method of claim 4, wherein the aluminum hydrocarbon comprises one or more of trimethyl aluminum, triethyl aluminum or dimethyl aluminum hydride.

6. The method of claim 1, wherein the alane-amine complex comprises dimethylethylamine alane, triethylamine alane, trimethylamine alane or methylpyrrolidine alane.

7. A method of depositing a film, the method comprising exposing a substrate surface to flows of a first precursor comprising TaCl$_5$ coordinated to a ligand, wherein the ligand comprises an amine ligand, and a second precursor comprising an aluminum-containing compound.

8. The method of claim 7, wherein the ligand comprises pyridine.

9. The method of claim 7, wherein the amine ligand comprises a tertiary amine.

10. The method of claim 7, wherein the aluminum-containing compound comprises an aluminum hydrocarbon.

11. The method of claim 10, wherein the aluminum hydrocarbon comprises one or more of trimethyl aluminum, triethyl aluminum or dimethyl aluminum hydride.

12. The method of claim 10, wherein the deposited film comprises tantalum, aluminum and carbon.

13. The method of claim 7, wherein the substrate surface is exposed to alternating flows of the first and second precursor sequentially.

14. The method of claim 7, wherein the substrate surface is exposed to the first and second precursor concurrently or substantially concurrently.

15. The method of claim 7, further comprising, prior to exposure of the substrate to the TaCl$_5$ coordinated to an amine ligand and the aluminum-containing compound, reacting Ta$_2$Cl$_{10}$ with a coordinating amine ligand to provide TaCl$_5$ coordinated to the amine ligand, wherein the ligand comprises one or more of acetonitrile or a tertiary amine.

* * * * *